United States Patent
Shen et al.

(10) Patent No.: US 9,418,899 B1
(45) Date of Patent: Aug. 16, 2016

(54) METHOD OF MULTI-WF FOR MULTI-VT AND THIN SIDEWALL DEPOSITION BY IMPLANTATION FOR GATE-LAST PLANAR CMOS AND FINFET TECHNOLOGY

(71) Applicant: GLOBALFOUNDRIES Inc., Grand Cayman (KY)

(72) Inventors: Yan Ping Shen, Saratoga Springs, NY (US); Min-hwa Chi, Malta, NY (US); Xusheng Wu, Ballston Lake, NY (US); Weihua Tong, Mechanicville, NY (US); Haiting Wang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/611,769

(22) Filed: Feb. 2, 2015

(51) Int. Cl.
| | |
|---|---|
| *H01L 27/092* | (2006.01) |
| *H01L 29/78* | (2006.01) |
| *H01L 21/8238* | (2006.01) |
| *H01L 21/3215* | (2006.01) |
| *H01L 21/28* | (2006.01) |
| *H01L 21/285* | (2006.01) |
| *H01L 29/66* | (2006.01) |
| *H01L 29/423* | (2006.01) |
| *H01L 29/49* | (2006.01) |

(52) U.S. Cl.
CPC .. *H01L 21/823842* (2013.01); *H01L 21/28088* (2013.01); *H01L 21/28185* (2013.01); *H01L 21/28568* (2013.01); *H01L 21/3215* (2013.01); *H01L 21/823821* (2013.01); *H01L 27/0922* (2013.01); *H01L 27/0924* (2013.01); *H01L 29/42372* (2013.01); *H01L 29/4966* (2013.01); *H01L 29/66545* (2013.01)

(58) Field of Classification Search
CPC .................. H01L 21/823842; H01L 21/28088
USPC .......................................... 257/369; 438/199
See application file for complete search history.

(56) References Cited

U.S. PATENT DOCUMENTS

| | | | |
|---|---|---|---|
| 7,994,051 B2 | 8/2011 | Hung et al. | |
| 8,951,884 B1 * | 2/2015 | Shih | H01L 21/823431 438/424 |
| 2014/0110778 A1 * | 4/2014 | Fumitake | H01L 29/78 257/330 |
| 2015/0228730 A1 * | 8/2015 | Yang | H01L 29/207 257/369 |

OTHER PUBLICATIONS

Khaled Ahmed et al."Transistor Wars". Spectrum, IEEE vol. 48,Issue:11), Oct. 28, 2011, pp. 50-66.
C. Auth et al. "A 22nm High Performance and Low-Power CMOS Technology Featuring Fully-Depleted Tri-Gate Transistors, Self-Aligned Contacts and High Density MIM Capacitors",VLSI Technology (VLSIT), 2012 Symposium on, pp. 131-132.
C.-H.Jan et al. "A 22nm SoC Platform Technology Featuring 3-D Tri-Gate and High-k/Metal Gate, Optimized for Ultra Low Power, High Performance and High Density SoC Applications", IEDM Tech. Dig., 2012, pp. 44-47.

* cited by examiner

*Primary Examiner* — Cuong Q Nguyen
*Assistant Examiner* — Tong-Ho Kim
(74) *Attorney, Agent, or Firm* — Ditthavong & Steiner, P.C.

(57) ABSTRACT

A method of forming RMG multi-WF layers for an nFET and pFET, and the resulting device are provided. Embodiments include forming a Si fin; forming a nFET RMG trench and a pFET RMG trench; forming a first Ti layer in the nFET and pFET RMG trenches; implanting $N_2$ in the first Ti layer vertically at a 0° implant angle in the pFET RMG trench; annealing the $N_2$ implanted first Ti layer to form a TiN layer in the pFET RMG trench; stripping un-reacted Ti of the first Ti layer; forming a second Ti layer in the nFET and pFET RMG trenches; implanting Al or C in the second Ti layer vertically at 0°; annealing the Al or C implanted second Ti layer to form TiAl or TiC at a bottom of the nFET and pFET RMG trenches, respectively; and filling the nFET and pFET RMG trenches with Al or W.

14 Claims, 11 Drawing Sheets

METHOD OF MULTI-WF FOR MULTI-VT AND THIN SIDEWALL DEPOSITION BY IMPLANTATION FOR GATE-LAST PLANAR CMOS AND FINFET TECHNOLOGY

TECHNICAL FIELD

The present disclosure relates to the manufacture of semiconductor devices with fin-type metal oxide semiconductor field effect transistors (FinFETs) and the front end of line (FEOL) process flow based on high-k metal gate (HKMG) structure. The disclosure is particularly applicable to the 20 nanometer (nm) technology node and beyond.

BACKGROUND

The integration scheme of Replacement Metal Gate (RMG) with high-k gate dielectric or "gate-last" flow for complementary metal-oxide semiconductor (CMOS) technology is dominating at the 20 nm node and beyond for both planar CMOS and FinFET. Multiple work-function (WF) metals are typically used for implementing the scheme of multi-threshold voltage (Vt) transistors in CMOS logic circuits. The Vt of a transistor may be tuned through implantation into metal gate in order to tune its WF selectively (using litho/mask steps). A known approach includes implanting species of fluorine (F) or Aluminum (Al) into the metal electrode material of a HKMG structure and followed by annealing to tune the Vt of FinFETs selectively. Another known approach includes selectively varying the thickness of WF material, e.g., titanium nitride (TiN) for p-type FinFET (pFET), and titanium aluminide (TiAl) or titanium carbide (TiC) for n-type FinFET (nFET) in HKMG flow selectively. However, the process for a multi-WF scheme is very challenging due to complicated patterning processes (using extra litho/masking steps), WF metal fill and strip/etching limitations, etc. and, therefore, yield is degraded significantly. In addition, deposition of WF material on the sidewall of an RMG can lead to gap-fill difficulty by the electrode material, e.g., Al or tungsten (W), and, therefore, serious scalability issues.

A need therefore exists for methodology enabling a simpler multi-WF scheme for RMG CMOS, and the resulting device.

SUMMARY

An aspect of the present disclosure is a process of forming TiN and TiAl or TiC WF layers in RMG by vertically implanting nitrogen gas ($N_2$) and Al or carbon (C), respectively, into titanium (Ti) layers, and forming multi-tapered fins in order to achieve multiple Vt values of FinFETs in a chip.

Another aspect of the present disclosure is device including multi-tapered fins with RMG having TiN WF for pFET and TiAl or TiC WF layers for nFET deposited or formed.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a Si fin; forming a nFET RMG trench and a pFET RMG trench, each over and perpendicular to the Si fin, the nFET and pFET RMG trenches being laterally separated; forming a first Ti layer in the nFET and pFET RMG trenches; implanting $N_2$ in the first Ti layer vertically at a 0° implant angle in the pFET RMG trench selectively; annealing the $N_2$ implanted first Ti layer to form a TiN layer at a bottom of the pFET RMG trench; stripping un-reacted Ti of the first Ti layer; forming a second Ti layer in the nFET and pFET RMG trenches; implanting Al or C in the second Ti layer vertically at a 0° implant angle; annealing the Al or C implanted second Ti layer to form TiAl or TiC at a bottom of the nFET and pFET RMG trenches, respectively; and filling the nFET and pFET RMG trenches with Al or W.

Aspects of the present disclosure include etching a profile of the active top portion to modify the profile toward more vertical or more tapered by higher direct current (DC) bias or lower DC bias, respectively, wherein the Si fin has an active top portion. Other aspects include etching the profile selectively to form multiple levels of sidewall verticality. Further aspects include implanting $N_2$ in the first Ti layer in the nFET RMG trench concurrently with the pFET RMG trench and annealing the $N_2$ implanted first Ti layer in the nFET RMG and pFET RMG trenches to form TiN at the bottom of the pFET RMG and nFET RMG trenches. Additional aspects include removing the unreacted Ti from sidewalls of the nFET and pFET RMG trenches, and removing TiN from the bottom of the nFET RMG trench selectively prior to forming the second Ti layer. Another aspect includes forming the first Ti layer to a thickness of 30 angstrom (Å) to 40 Å. Other aspects include annealing the $N_2$ implanted and Al or C implanted Ti layers at 400° C. to 900° C. or as a flash/laser anneal. Further aspects include forming the TiN layer to a thickness of 40 Å to 60 Å. Additional aspects include removing unreacted portions of the first Ti layer from side surfaces of the pFET and nFET RMG trenches after annealing the $N_2$ implanted first Ti layer and prior to forming the second Ti layer. Another aspect includes forming the TiAl or TiC layers to a thickness of 40 Å to 120 Å.

Another aspect of the present disclosure is a device including: a Si fin; a nFET RMG trench over and perpendicular to the Si fin; a pFET RMG trench over and perpendicular to the Si fin, the nFET and pFET RMGs laterally separated; a pFET work function material at a bottom of the pFET trench; and an nFET work function material at a bottom of the nFET trench and over the pFET work function material in the pFET trench; and W or Al filling a remainder of the nFET and pFET trenches.

Aspects of the device include the Si fin sidewalls being formed of multiple levels of verticality. Other aspects include the nFET work function material being formed of a layer of TiAl or TiC at a bottom of the nFET RMG under a layer of Al or W, the layer of Al or W filling the nFET RMG. Further aspects include the TiAl or TiC layers being formed to a thickness of 40 Å to 120 Å. Additional aspects include the pFET work function material being formed of a layer of TiN at a bottom of the pFET RMG under a layer of Al or W, the layer of Al or W filling the nFET RMG. Another aspect includes the TiN layer in the pFET RMG trench being formed to a thickness of 40 Å to 60 Å.

Another aspect of the present disclosure is a method including: forming a Si fin, the Si fin having an active top portion; etching a profile of the Si fin selectively to form multiple levels of verticality; forming a nFET RMG trench and a pFET RMG, the nFET and pFET RMG trenches laterally separated; forming a high-k dielectric layer at a bottom of the nFET and pFET RMG trenches; depositing a first Ti layer to a thickness of 30 Å to 40 Å over the high-k dielectric layer in the nFET and pFET RMG trenches; implanting $N_2$ at least in the first Ti layer of the pFET vertically at a 0° implant angle selectively; performing a first rapid thermal anneal (RTA) after the N₂ implant to form a TiN layer at least in the pFET RMG trench; removing unreacted Ti from both the nFET and pFET RMG trenches and any TiN formed in the nFET RMG trench selectively; depositing a second Ti layer in the pFET and nFET RMG trenches; implanting Al or C in the second Ti layer vertically at a 0° implant angle; performing a second RTA after the Al or C implantation to form TiAl or TiC at the bottom of the nFET and pFET RMG trenches, respectively; and filling the nFET and pFET RMG trenches with a Al or W.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2, 3B, 4B, and 5 through 8 schematically illustrate another RMG process flow for both an nFET and a pFET, in accordance with another exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of complicated process of patterning, multiple WF deposition selectively, metal electrode material gap-fill, etching limitations, and yield degradation attendant upon implementing a multi-WF scheme for multi-Vt for n/p FinFETs.

Methodology in accordance with embodiments of the present disclosure includes forming a Si fin. A nFET RMG trench and a pFET RMG trench are each formed over and perpendicular to the Si fin, the nFET and pFET RMG trenches being laterally separated. A first Ti layer is formed in the nFET and pFET RMG trenches. The first Ti layer in the pFET RMG trench is implanted with N₂ vertically at a 0° implant angle selectively. The N₂ implanted first Ti layer is annealed to form a TiN layer at a bottom of the pFET RMG trench. Un-reacted Ti of the first Ti layer is stripped. A second Ti layer is formed in the nFET and pFET RMG trenches. Al or C is implanted in the second Ti layer vertically at a 0° implant angle. The Al or C implanted second Ti layer is annealed to form TiAl or TiC at a bottom of the nFET and pFET RMG trenches, respectively. The nFET and pFET RMG trenches are filled with Al or W.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
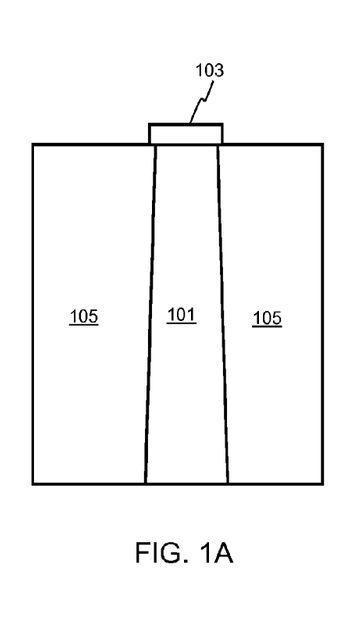
FIGS. 1A through 1D schematically illustrate a process flow for forming a FinFET fin with tapered sidewalls for Vt tuning and multi-Vt schemes.
Figure 1B:
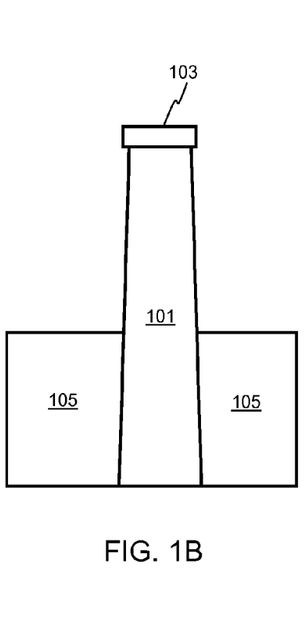
Figure 1C:
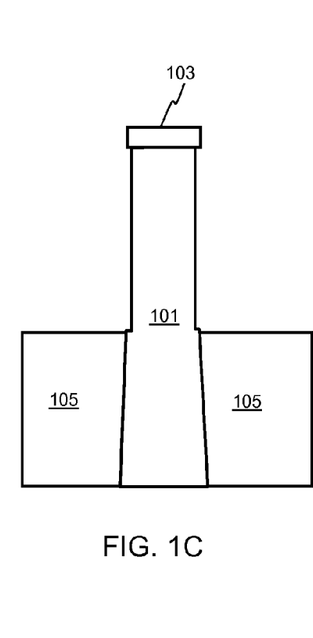

FIGS. 1A through 1D schematically illustrate a process flow for forming a FinFET fin with tapered sidewalls for Vt tuning and multi-Vt schemes. Adverting to FIG. 1A, a Si fin 101 is formed, e.g., by etching. A hard mask 103 is then formed on a top surface of the Si fin 101, e.g., by multi-layer deposition, patterning, and etching. Next, an oxide layer 105, e.g., a shallow trench isolation (STI) layer, is deposited on opposite sides of the Si fin 101. The Si fin 101 is then implanted, e.g., by a punch-through-stop (PTS) vertical implant. The oxide layer 105 may then be recessed, e.g., 20 nm to 60 nm, to reveal the active Si fin 101, as depicted in FIG. 1B. After the oxide layer 105 is recessed, the active Si fin 101 may already have some tapering, i.e., the lower portion of the active Si fin 101 is wider than the upper portion of the active Si fin 101. The sidewalls of the active Si fin 101 may then be modified, e.g., by plasma Si etching with a higher or lower DC bias, as depicted in FIG. 1C. For example, the Si etching may be performed at a DC bias of 0.5-5 kilovolts (kV) with a higher DC bias for more vertical etching, i.e., making the sidewalls less tapered. In addition, the modification of the sidewalls may be performed selectively by masking steps to form fins with multiple levels of verticality (not shown for illustrative convenience) or less tapering. In particular, when the active Si fin 101 is formed with multiple groups of tapered sidewalls selectively, e.g., with extra masking and Si etching steps, multi-Vt may result from the width of fin as well as the WF formation by vertical implant over the sloped fins. Further, the multi-Vt scheme can be applicable to both n-type and p-type FinFETs.

Figure 1D:
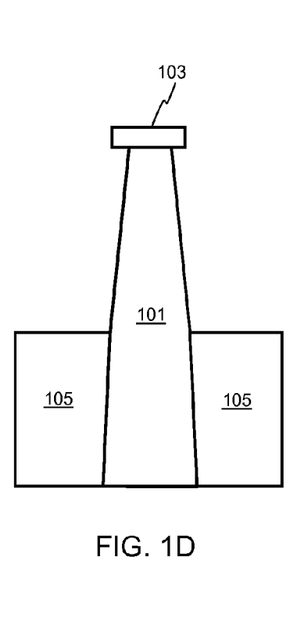
Figure 2:
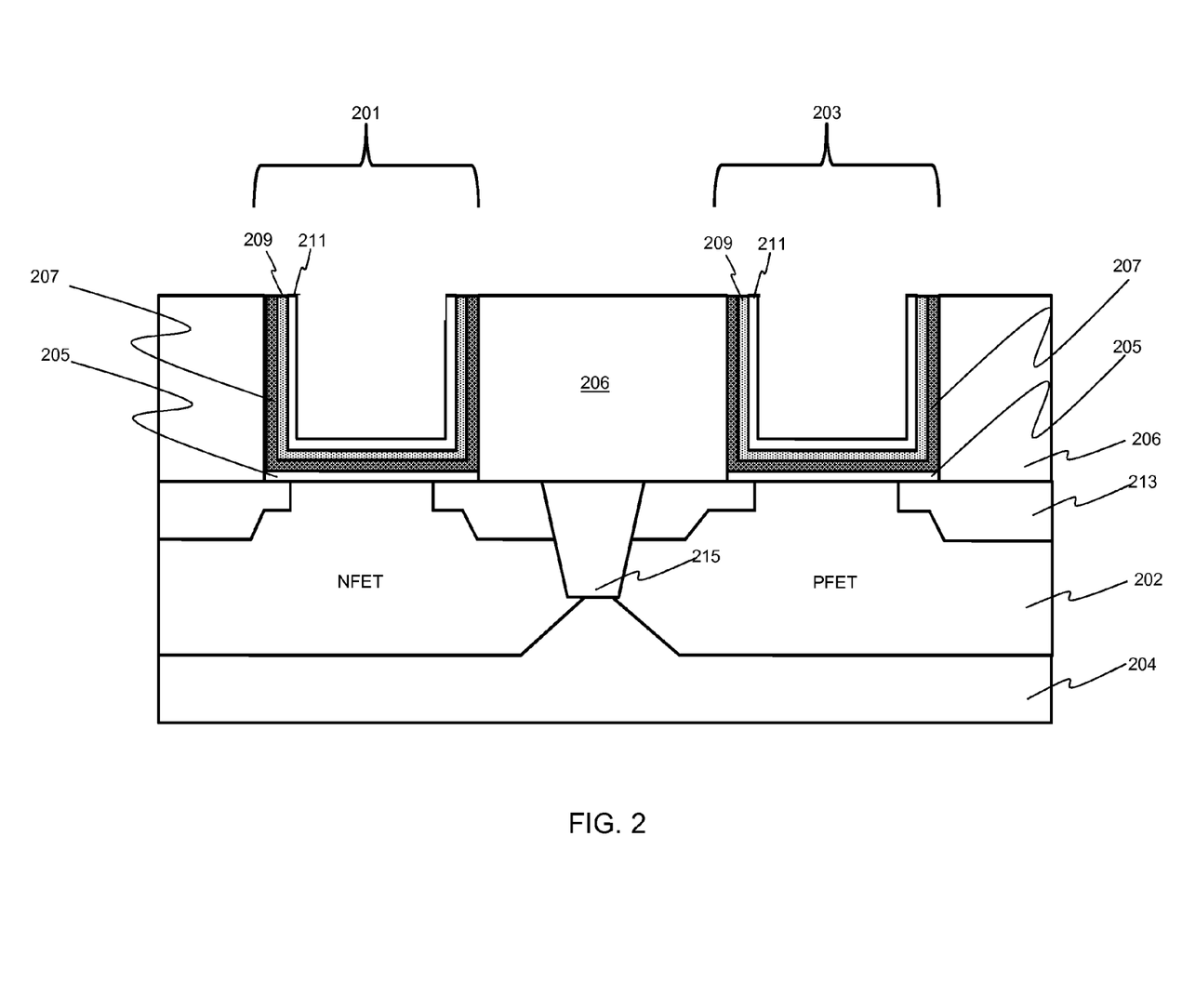
FIGS. 2, 3A, 4A, and 5 through 8 schematically illustrate an RMG process flow for both an nFET and a pFET, in accordance with an exemplary embodiment.

The sidewalls of the active Si fin 101 may also be modified, e.g., by plasma Si etching, to be more tapered by adding lateral etching, as depicted in FIG. 1D. For example, the Si etching may be performed with a pressure range of 10 milli-Torr (mTorr) to 10 Torr, with higher operating pressure used for more lateral etching and, therefore, achieving a more tapered slope. The modification of the active Si fin 101 to increase sidewall tapering may also be performed selectively by masking steps to form fins with multiple levels for a multi-Vt scheme. Alternatively, the steps of recessing the oxide 105 in FIG. 1B and plasma etching of the active Si fin 101 in FIG. 1C or 1D may be combined by tuning selectivity. Thereafter, the hard mask 103 is removed (not shown for illustrative convenience).

FIGS. 2 through 8 are cross-sectional views of RMG across an nFET and a pFET (parallel to the fin) schematically illustrating an RMG process flow. Adverting to FIG. 2, after the Si fin 202 is formed in a silicon substrate 204 by the process flow of FIGS. 1A through 1D, a nFET RMG trench 201 and a pFET RMG trench 203 are formed in an interlayer dielectric (ILD) 206 over and perpendicular to the Si fin 202. An interfacial layer (IL) 205, e.g. an oxide layer, a high-k dielectric layer 207, and a TiN capping layer 209 are sequentially deposited, e.g., by ALD, in the nFET RMG trench 201 and the pFET RMG trench 203. The TiN layer 209 may be formed, for example, to a thickness of 15 Å for capping the high-k dielectric layer 207. An amorphous silicon (a-Si) deposition, annealing, and a-Si removal (all not shown for illustrative convenience) are performed for purpose of improving reliability of the high-k dielectric layer 207. Next, a TaN capping layer 211 may be formed, for example, to a thickness of 10 Å to 15 Å. Note that the FinFET's source/drain regions 213 and a STI region 215 have been formed previously by conventional methods.

Figure 3A:
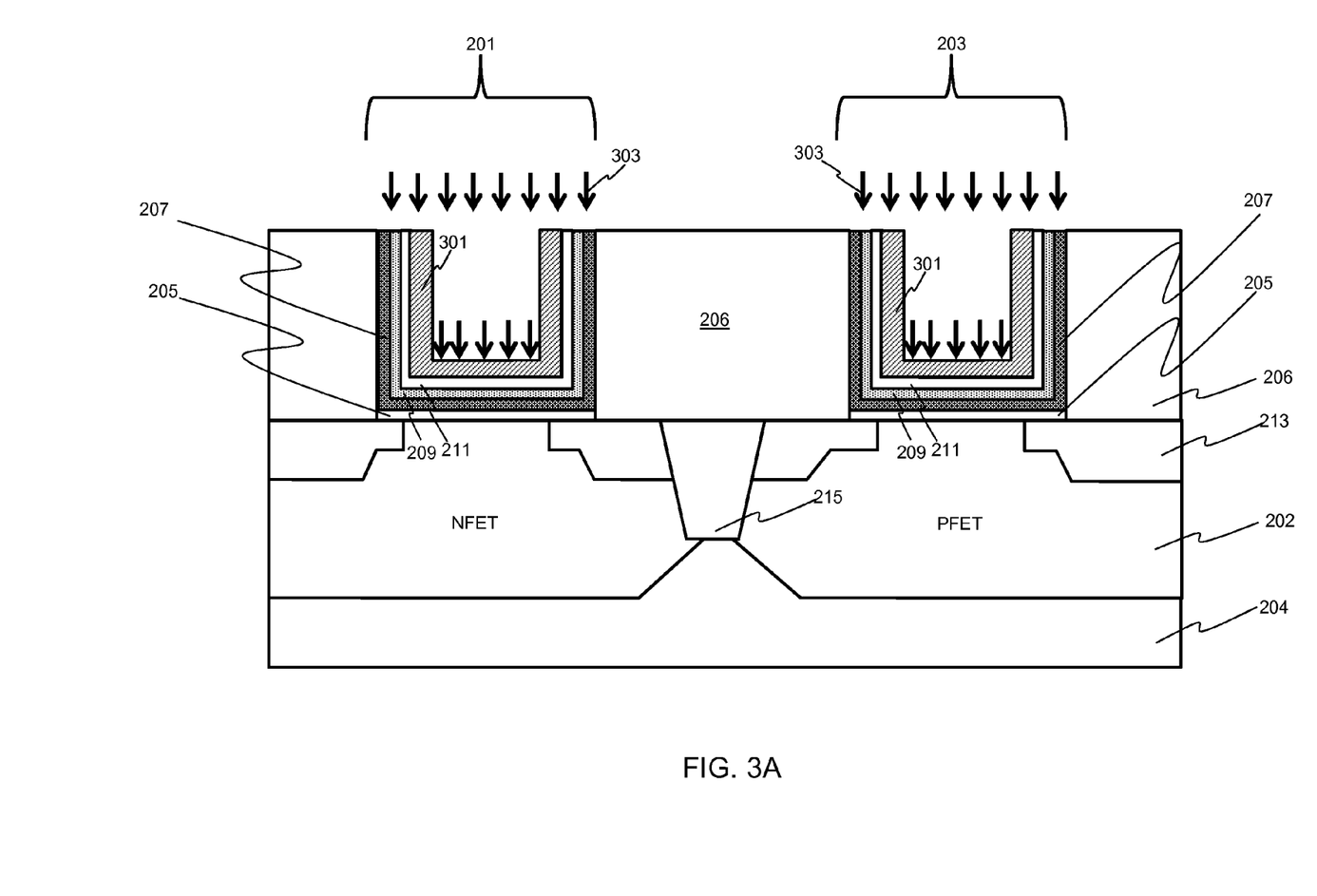
Figure 4A:
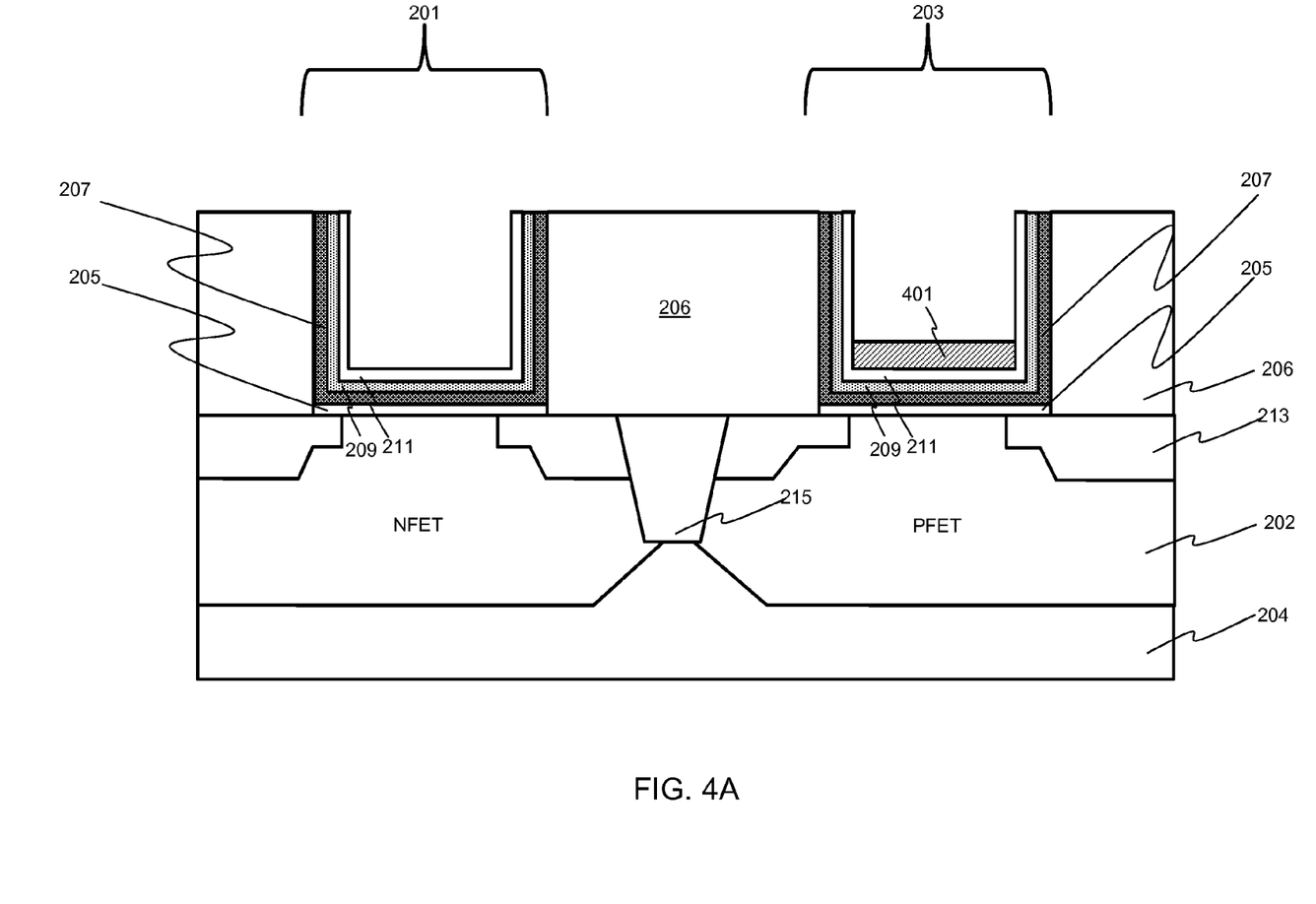

Adverting to FIG. 3A, a Ti layer 301 is deposited in the nFET RMG trench 201 and the pFET RMG trench 203 concurrently. The Ti layer 301 may be formed, for example, to a thickness of 30 Å to 40 Å by plasma vapor deposition (PVD). Next, $N_2$ is blanket implanted concurrently in the nFET RMG trench 201 and the pFET RMG trench 203 vertically (referred to as a 0° implant angle) as shown by the arrows 303. The $N_2$ may be implanted, for example, at an energy of 0.2 kiloelectron-volt (Kev) to 1 Kev and at a dose of $1\times10^{15}$ to $1\times10^{17}$ per $cm^2$. The $N_2$ implanted Ti layer 301 is then annealed, e.g., by RTA, to form a TiN layer 401 at the bottom of the nFET RMG trench 201 and the pFET RMG trench 203. The RTA may be performed at a temperature of 400° C. to 900° C. depending on the dwell time or as a flash/laser anneal. Note that the amount of $N_2$ implanted into the Ti layer 301 over the sidewall of fins (not shown for illustrative convenience) increases slightly proportional to the taperness of the fin sidewall, i.e. a more tapered sidewall receives more $N_2$ implant dose, and in turn, the TiN is more $N_2$-rich and toward slightly larger WF. The difference in WF will result in pFET Vt difference and, therefore, the taperness of fin sidewalls can result in different pFET Vt. Thereafter, any unreacted portions of the Ti layer 301 are removed, e.g., by wet etching, from the side surfaces of the nFET RMG trench 201 and the pFET RMG trench 203. Next, the TiN layer 401 in the nFET RMG trench 201 is etched selectively, e.g., by litho/masking steps to open the nFET RMG trench 201, the result of which is depicted in FIG. 4A.

Figure 3B:
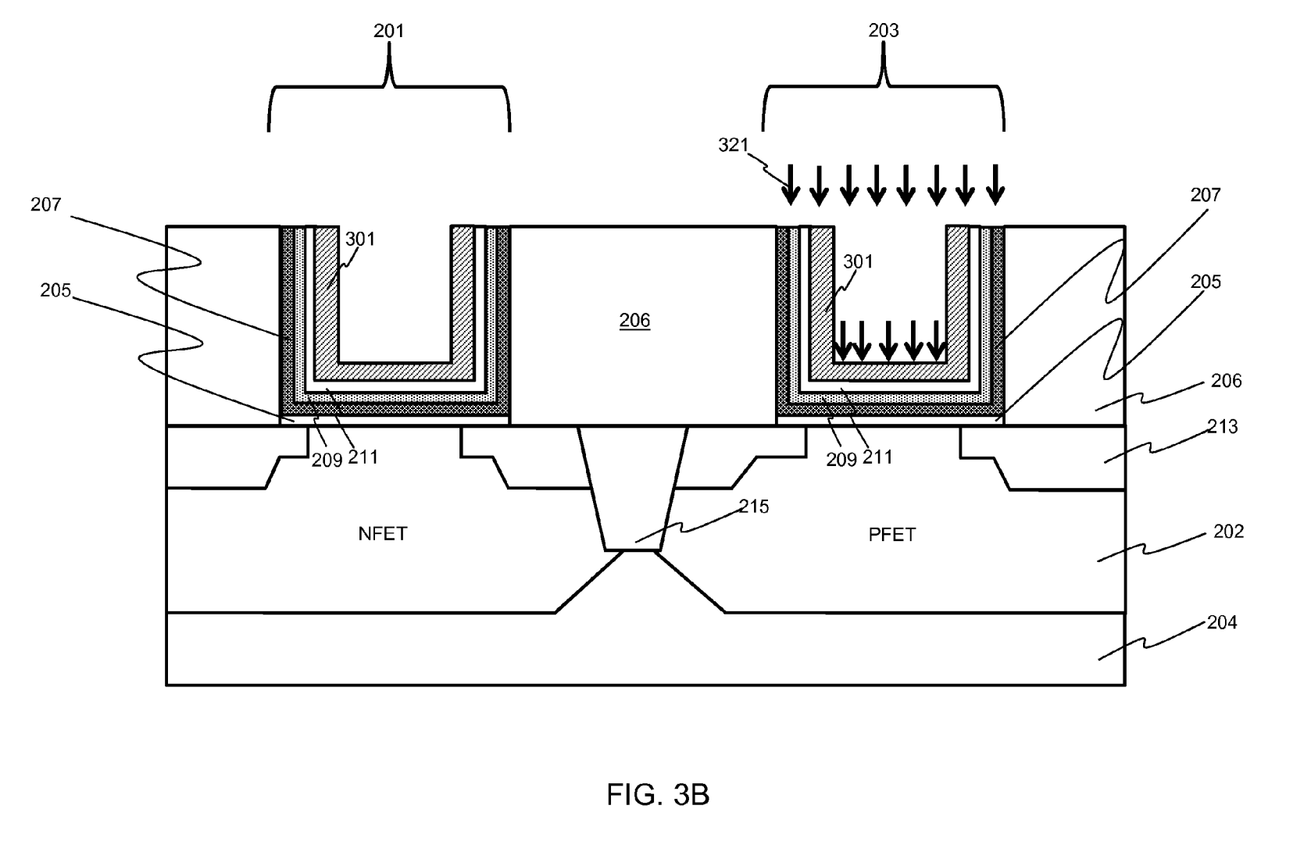
Figure 4B:
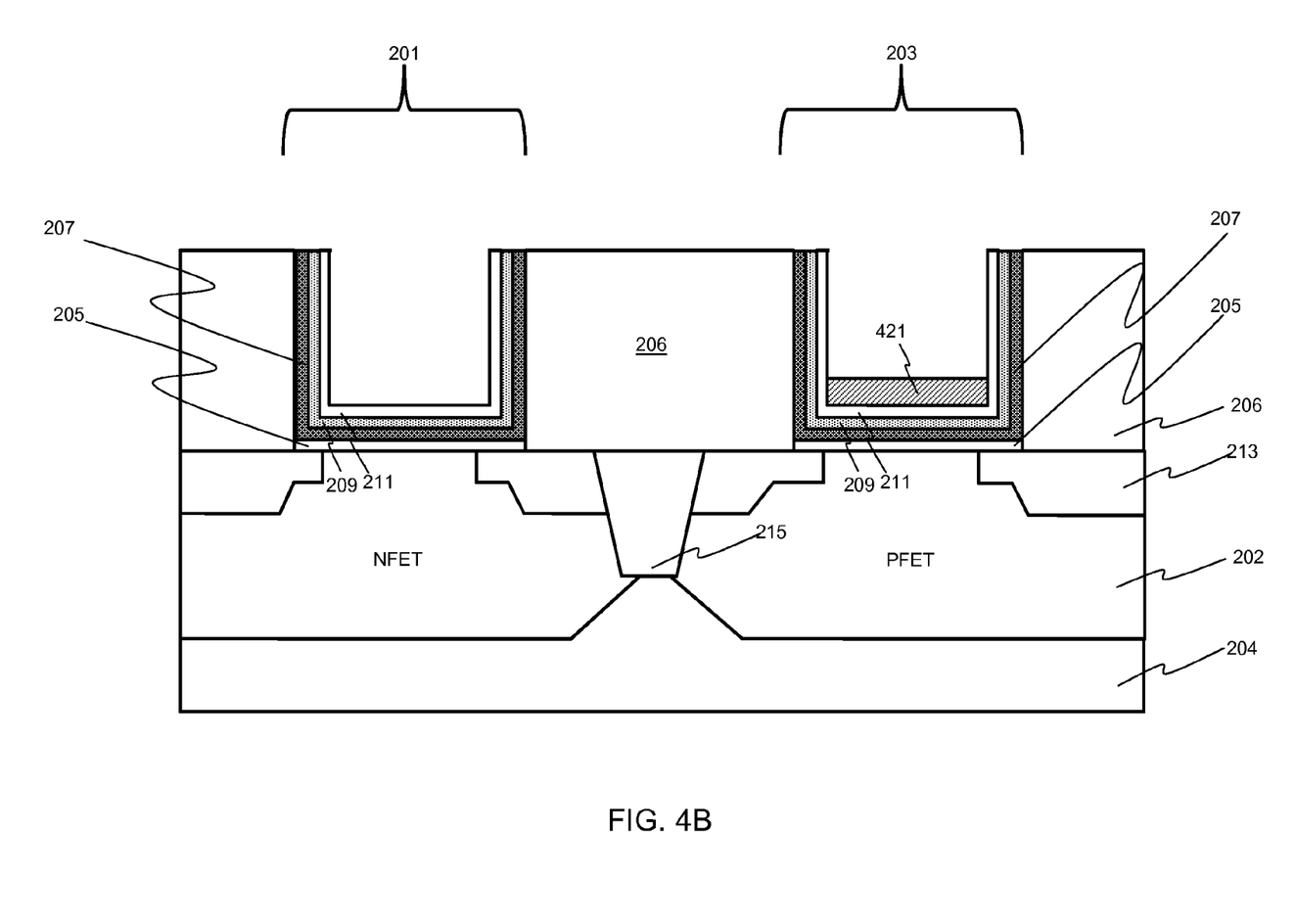

Adverting to FIG. 3B, after the Ti layer 301 is deposited in the nFET RMG trench 201 and the pFET RMG trench 203, the $N_2$ may be alternatively implanted vertically at a 0° implant angle to the pFET RMG trench 203 selectively, e.g., by litho/masking steps opening pFET area, as shown by the arrows 321. The dosage and energy of the $N_2$ implant of FIG. 3B may be the same as the $N_2$ implant of FIG. 3A. Similarly, the $N_2$ implanted Ti layer 301 is then annealed, e.g., by RTA, to form a TiN layer 421 at the bottom of the pFET RMG trench 203, as depicted in FIG. 4B. Similar to FIG. 4A, any unreacted portions of the Ti layer 301 are removed, e.g., by wet etching, from the side surfaces of the nFET RMG trench 201 and the pFET RMG trench 203. However, because the $N_2$ implant of FIG. 3B is selective, the TiN layer 421 is not formed in the bottom of nFET RMG trench 201, and the un-reacted Ti 301 on the bottom of nFET RMG trench 201 is also removed as illustrated in FIG. 4B. Note that FIGS. 4A and 4B are practically the same structure.

Figure 5:
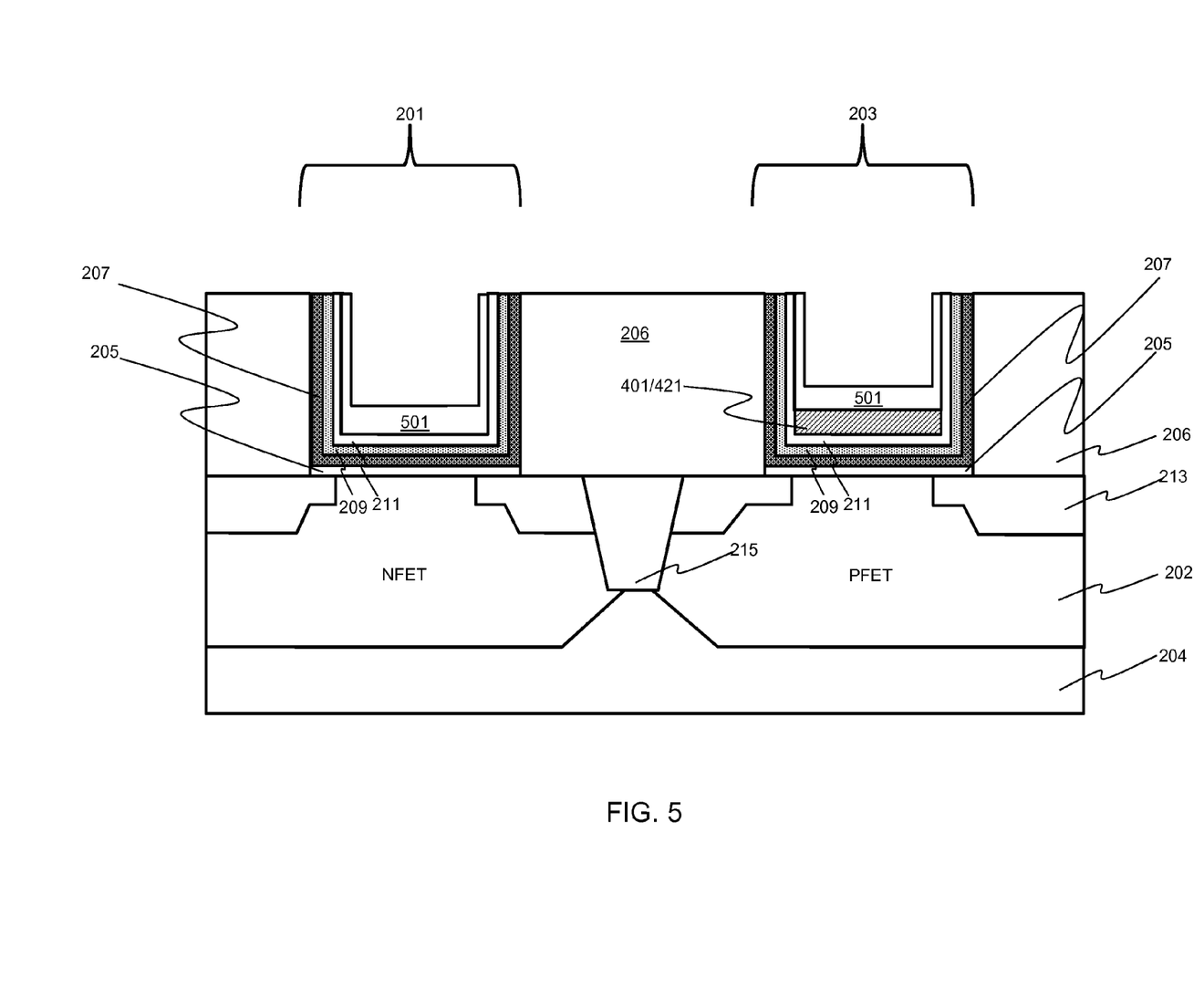
Figure 6:
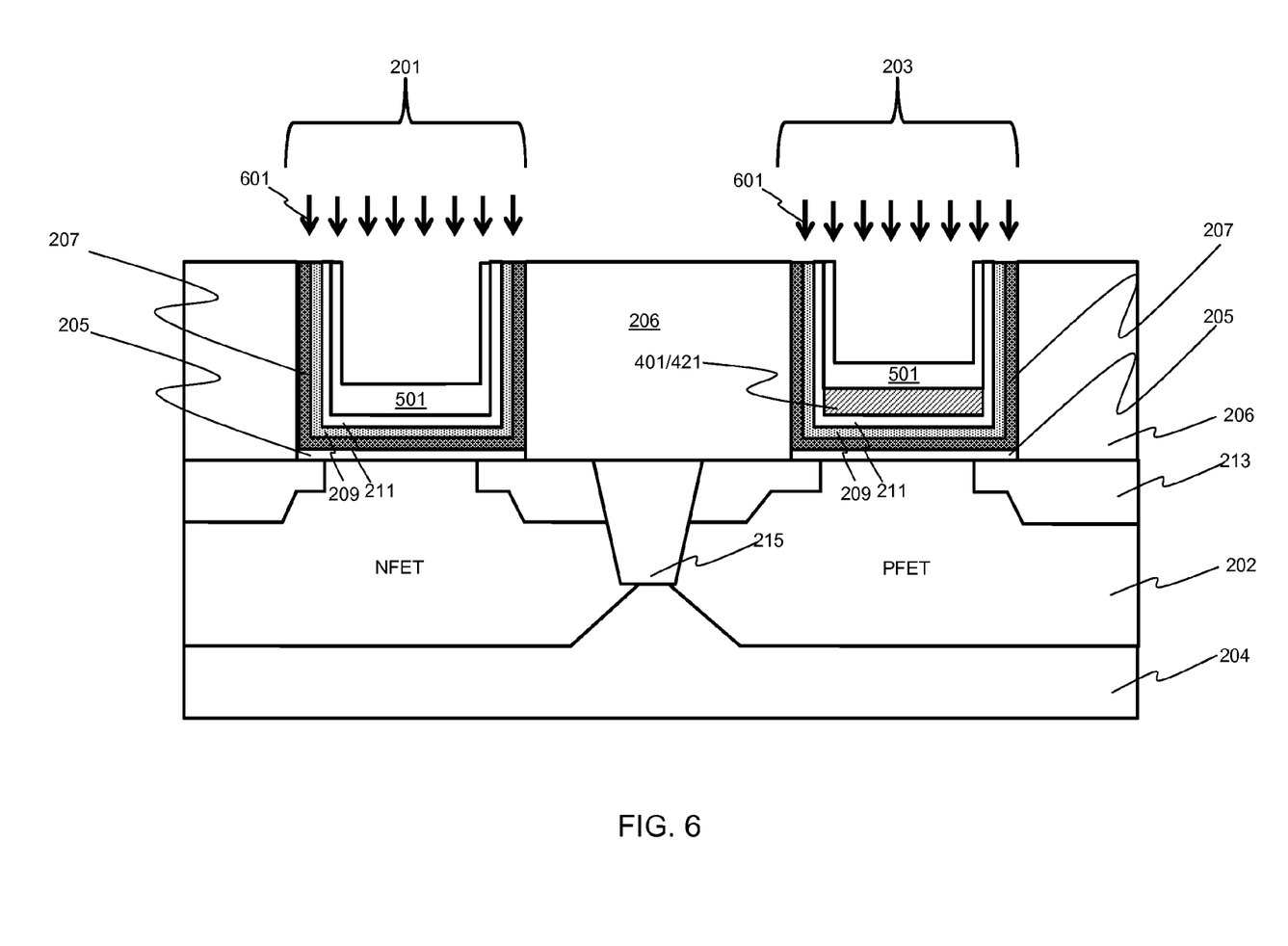
Figure 7:
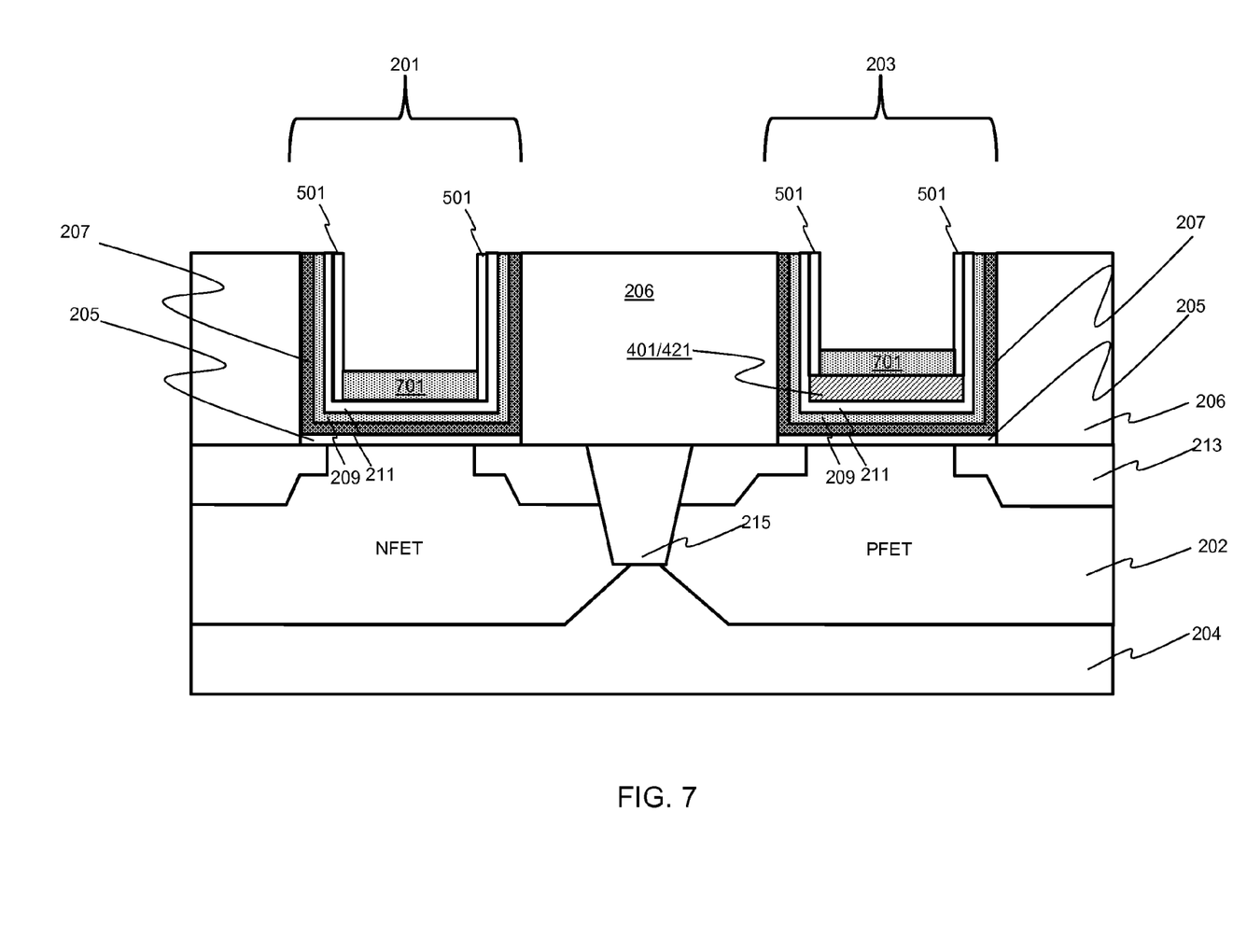

A Ti layer 501 is deposited in the nFET RMG trench 201 and over the TiN layer 401/421 in the pFET RMG trench 203, as depicted in FIG. 5. Adverting to FIG. 6, the Ti layer 501 is implanted with either Al or C vertically at a 0° implant angle as shown by the arrows 601. The Al or C may be blanket implanted with a dose of $1\times10^{15}$ to $1\times10^{17}$ per $cm^2$ to achieve 7 to 50 atomic percent (at. %) in resulting TiAl or TiC, which is formed, e.g., to a thickness of 60 Å to 120 Å. Thereafter, the Al or C implanted Ti layer 501 is annealed, for example, by RTA at a temperature of 400° C. to 900° C. depending on the dwell time or flash/laser anneal to form a TiAl or TiC layer 701, respectively on the bottom of the nFET and pFET RMG trenches 201 and 203, respectively, as depicted in FIG. 7. The TiAl or TiC layer 701 may be formed, for example, to a thickness of 60 Å to 120 Å as a n-WF. The p-WF for the pFET RMG trench 203 is determined by the TiN layer 401/421 as it is nearest to the high-k dielectric 207. Similarly, the amount of Al or C implanted into the Ti layer 301 over the sidewall of fins (not shown for illustrative convenience) increases slightly proportional to the taperness of the fin sidewall, i.e., a more tapered sidewall receives more Al or C implant dose; and in turn, the TiAl or TiC is more Al-rich or C-rich and toward slightly smaller work-function on the more tapered fin sidewall. The difference in WF will result in nFET Vt difference and, therefore, the taperness of fin sidewalls can result in different nFET Vt.

Figure 8:
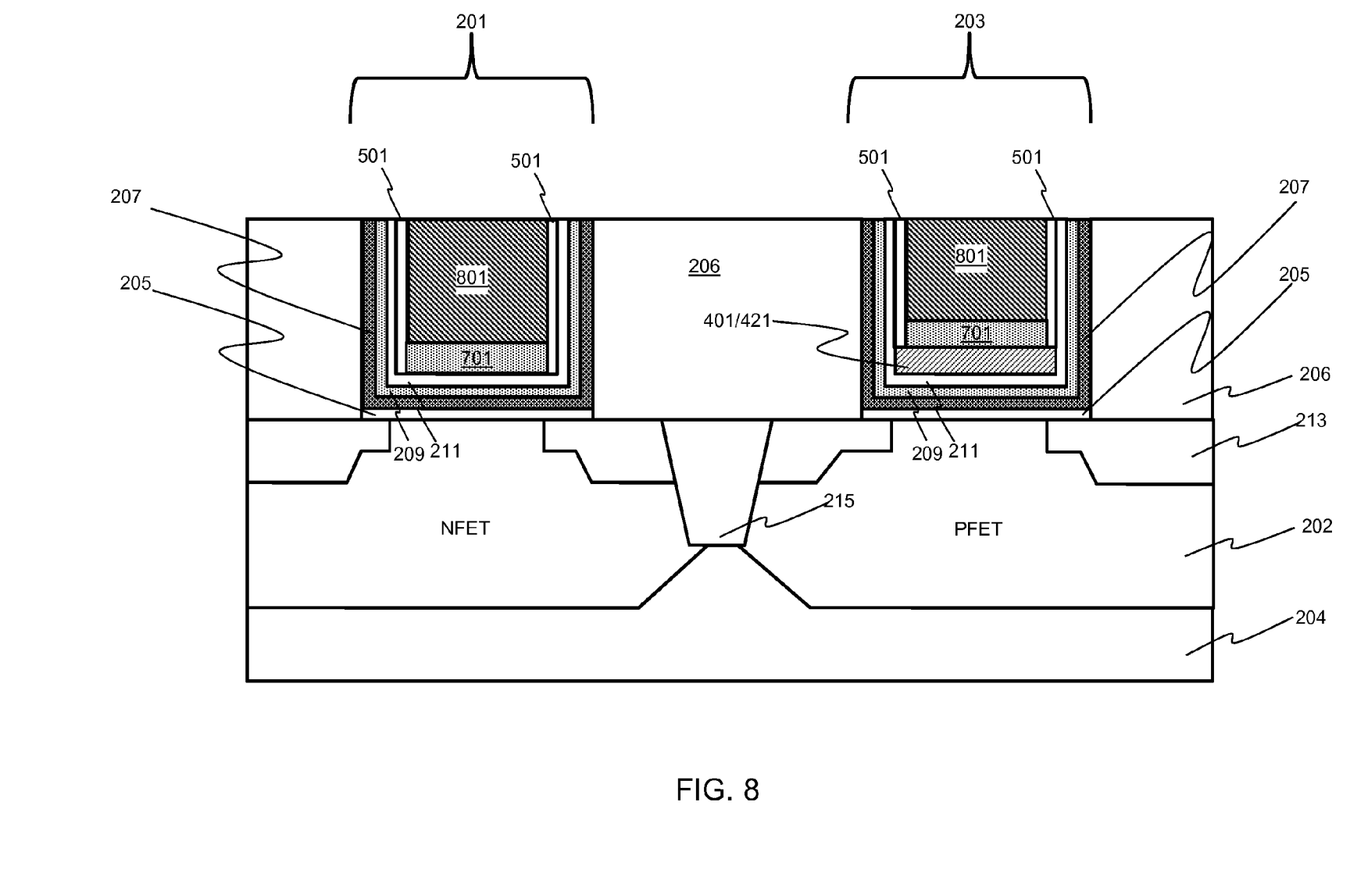

The nFET RMG trench 201 and the pFET RMG 203 are filled with an Al or W layer 801 and then planarized, e.g., by CMP, as depicted in FIG. 8. Note that the materials deposited on top of ILD 206 are now removed by CMP as shown FIG. 8, but not shown in FIGS. 3 through 7 for simplicity and so as not to obscure the illustration. The Al or W layer 801 may be formed to a thickness of 1000 Å to 2000 Å by PVD or chemical vapor deposition (CVD), respectively. Because the Ti layer 501 is already on the sidewalls of the nFET RMG trench 201 and the pFET RMG trench 203, there is no need for forming an additional TiN/Ti layer before the Al PVD as in conventional flow. Thereafter, conventional FinFET processing steps proceed.

Figure 9A:
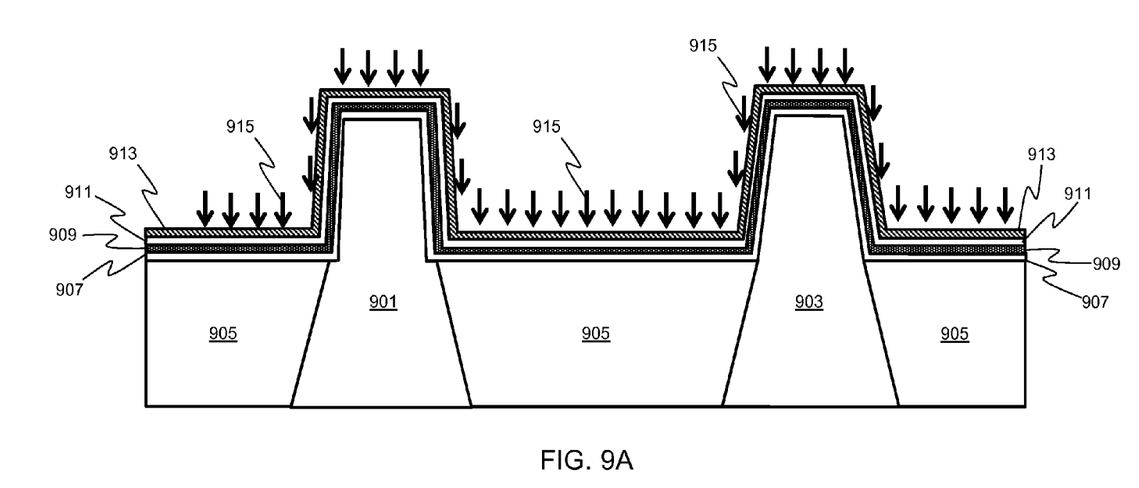
FIGS. 9A and 9B schematically illustrate a process flow for p-WF formation by ALD deposition of TiN/Ti followed by N₂ implantation, in accordance with an exemplary embodiment.
Figure 9B:
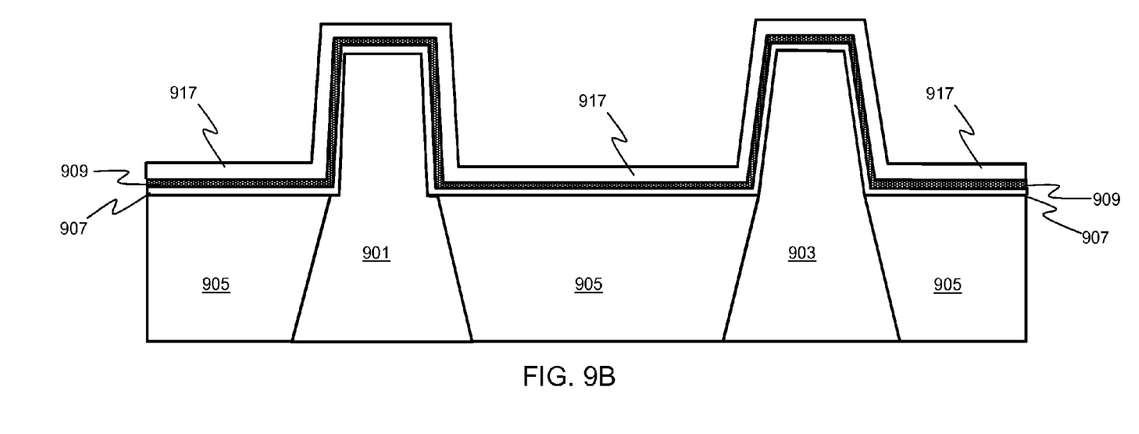

FIGS. 9A and 9B are cross sectional views across the RMGs (perpendicular to a fin). Adverting to FIG. 9A, Si fins 901 and 903 are formed in a STI layer 905. Si fin 901 represents a Si fin with an active portion having a standard vertical profile and Si fin 903 represents a Si fin with an active portion having a more tapered profile. Similar to FIG. 2, once the nFET RMG trench and the pFET RMG trench (both not shown for illustrative convenience) are opened, an IL layer 907, a high-k dielectric layer 909, and a TiN/TaN capping layer 911 are each deposited, e.g., by ALD, over the fins 901 and 903 and the STI layer 905. Next, a Ti layer 913 is deposited over the TiN/TaN layer 911. $N_2$ is then blanket implanted in the Ti layer 913 vertically at a 0° implant angle as shown by the arrows 915. Thereafter, the $N_2$ implanted Ti layer 913 is annealed to form a $N_2$ rich TiN layer 917, as depicted in FIG. 9B. The un-reacted Ti (not shown for illustrative purposes) is then stripped.

A vertical $N_2$ (or Al or C) implant into Ti (with tapered fin) results in a fraction, i.e., a factor of cos (θ), of the total implant dose of the actually implanted amount into the Ti. The θ denotes the taper angle, the angle between the sidewall to Si substrate surface. Thus, the total amount of $N_2$ implanted into Ti depends on the taper angle of the tapered sidewall profile. Truly vertical sidewalls will get a zero dose. Thus, the WF of TiN depends on the amount of $N_2$ implant dose in Ti; and a thicker (thinner) layer of TiN (or TiAl or TiC) leads toward larger WF, i.e., more p-type metal, or smaller WF, i.e., more n-type metal, respectively. In turn, Vt can be adjusted accordingly by the different WF relative to the effective $N_2$ dose into the fin, e.g., Dose×cos (θ q). Similarly, the TiAl (or TiC) WF layer for n-type FinFet can be formed by implanting Al (or C) vertically into Ti, and the TiAl (or TiC) WF depends on the level of the fin's taper. In short, by using the method of implanting $N_2$, Al, or C into Ti, the WF can be adjusted by the fin sidewall taperness; a new scheme for tuning WF to achieve multi-Vt of FinFETs.

The embodiments of the present disclosure can achieve several technical effects including tuning the WF by modifying the taperness of the fin sidewall so that the amount or dose of $N_2$ or Al or C implanted into the WF layer determines the WF. The multi-tapered profile leads to multi-WF and in turn multi-Vt for n/p FinFETs. In addition, the WF layers are formed bottom-up in RMG trenches and, therefore, there is a minimum deposition of WF material on the sidewall of the RMG leading to stronger scalability for future FinFET technology. Because multiple WF material layers are deposited selectively, the present disclosure is much simpler than conventional multi-WF schemes. Further, the present disclosure can be implemented for FinFETs on bulk or SOI. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in the 20 nm technology node and beyond.

In the preceding description, the disclosed process is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a silicon (Si) fin;
   forming a n-type field effect transistor (nFET) replacement metal gate (RMG) trench and a p-type FET (pFET) RMG trench, each over and perpendicular to the Si fin, the nFET and pFET RMG trenches being laterally separated;
   forming a first titanium (Ti) layer in the nFET and pFET RMG trenches;
   implanting nitrogen gas ($N_2$) in the first Ti layer vertically at a 0° implant angle in the pFET RMG trench selectively;
   annealing the $N_2$ implanted first Ti layer to form a titanium nitride (TiN) layer at a bottom of the pFET RMG trench;
   stripping un-reacted Ti of the first Ti layer;
   forming a second Ti layer in the nFET and pFET RMG trenches;
   implanting aluminum (Al) or carbon (C) in the second Ti layer vertically at a 0° implant angle;
   annealing the Al or C implanted second Ti layer to form titanium aluminide (TiAl) or titanium carbide (TiC) at a bottom of the nFET and pFET RMG trenches, respectively; and
   filling the nFET and pFET RMG trenches with Al or tungsten (W).

2. The method according to claim 1, wherein the Si fin has an active top portion, the method further comprising etching a profile of the active top portion to modify the profile toward more vertical or more tapered by higher direct current (DC) bias or lower DC bias, respectively.

3. The method according to claim 2, comprising etching the profile selectively to form multiple levels of sidewall verticality.

4. The method according to claim 1, further comprising implanting $N_2$ in the first Ti layer in the nFET RMG trench concurrently with the pFET RMG trench and annealing the $N_2$ implanted first Ti layer in the nFET RMG and pFET RMG trenches to form TiN at the bottom of the nFET RMG and pFET RMG trenches.

5. The method according to claim 4, further comprising removing the unreacted Ti from sidewalls of the nFET RMG and pFET RMG trenches and removing TiN from the bottom of the nFET RMG trench selectively prior to forming the second Ti layer.

6. The method according to claim 1, comprising forming the first Ti layer to a thickness of 30 angstrom (Å) to 40 Å.

7. The method according to claim 1, comprising annealing the $N_2$ implanted and Al or C implanted Ti layers at 400° C. to 900° C. or as a flash/laser anneal.

8. The method according to claim 1, comprising forming the TiN layer to a thickness of 40 Å to 60 Å.

9. The method according to claim 1, further comprising removing unreacted portions of the first Ti layer from side surfaces of the pFET and nFET RMG trenches after annealing the $N_2$ implanted first Ti layer and prior to forming the second Ti layer.

10. The method according to claim 1, comprising forming the TiAl or TiC layers to a thickness of 40 Å to 120 Å.

11. A method comprising:
    forming a silicon (Si) fin, the Si fin having an active top portion;
    etching a profile of the Si fin selectively to form multiple levels of verticality;
    forming a n-type field effect transistor (nFET) replacement metal gate (RMG) trench and a p-type FET (pFET) RMG, the nFET and pFET RMG trenches laterally separated;
    forming a high-k dielectric layer at a bottom of the nFET and pFET RMG trenches;
    depositing a first titanium (Ti) layer to a thickness of 30 angstrom (Å) to 40 Å over the high-k dielectric layer in the nFET and pFET RMG trenches;
    implanting nitrogen gas ($N_2$) at least in the first Ti layer of the pFET vertically at a 0° implant angle selectively;
    performing a first rapid thermal anneal (RTA) after the $N_2$ implant to form a titanium nitride (TiN) layer at least in the pFET RMG trench;
    removing unreacted Ti from both the nFET and pFET RMG trenches and any TiN formed in the nFET RMG trench selectively;
    depositing a second Ti layer in the pFET and nFET RMG trenches;
    implanting aluminum (Al) or carbon (C) in the second Ti layer vertically at 0° implant angle;
    performing a second RTA after the Al or C implantation to form titanium aluminide (TiAl) or titanium carbide (TiC) at the bottom of the nFET and pFET RMG trenches, respectively; and
    filling the nFET and pFET RMG trenches with a Al or tungsten (W).

12. The method according to claim 11, comprising performing the first and second RTAs at 400° C. to 900° C. or as a laser/flash anneal.

13. The method according to claim 11, comprising forming the TiN layer to a thickness of 40 Å to 60 Å.

14. The method according to claim 11, comprising forming the TiAl or TiC layers to a thickness of 40 Å to 120 Å.

* * * * *